(12) United States Patent
Russ et al.

(10) Patent No.: US 7,709,896 B2
(45) Date of Patent: May 4, 2010

(54) ESD PROTECTION DEVICE AND METHOD

(75) Inventors: Cornelius Christian Russ, Diedorf (DE); David Alvarez, Essex, VT (US); Kiran V. Chatty, Williston, VT (US); Jens Schneider, Munich (DE); Robert Gauthier, Hinesburg, VT (US); Martin Wendel, Hohenbrunn (DE)

(73) Assignee: Infineon Technologies AG, Munich (DE)

( * ) Notice: Subject to any disclaimer, the term of this patent is extended or adjusted under 35 U.S.C. 154(b) by 571 days.

(21) Appl. No.: 11/370,369

(22) Filed: Mar. 8, 2006

(65) Prior Publication Data

US 2007/0210387 A1  Sep. 13, 2007

(51) Int. Cl.
*H01L 23/62* (2006.01)

(52) U.S. Cl. .................. 257/355; 257/357; 257/362; 257/E27.06; 257/E29.255

(58) Field of Classification Search .................. 257/499, 257/355–362, E27.06, E29.255
See application file for complete search history.

(56) References Cited

U.S. PATENT DOCUMENTS

| | | | |
|---|---|---|---|
| 4,400,711 A | 8/1983 | Avery | |
| 4,649,629 A | 3/1987 | Miller et al. | |
| 4,896,243 A | 1/1990 | Chatterjee et al. | |
| 4,939,616 A | 7/1990 | Rountree | |
| 4,968,639 A | 11/1990 | Bergonzoni | |
| 5,012,317 A | 4/1991 | Rountre | |
| 5,077,590 A | 12/1991 | Fujihira | |
| 5,142,345 A | 8/1992 | Miyata | |
| 5,225,702 A | 7/1993 | Chatterjee | |
| 5,234,853 A | 8/1993 | Ikemasu | |
| 5,272,097 A | 12/1993 | Shiota | |
| 5,374,565 A | 12/1994 | Hsue et al. | |
| 5,465,189 A | 11/1995 | Polgreen et al. | |
| 5,646,062 A | 7/1997 | Yuan et al. | |
| 5,674,761 A | 10/1997 | Chang et al. | |
| 5,789,784 A | 8/1998 | Chang et al. | |
| 5,910,873 A | 6/1999 | Bolua et al. | |
| 5,918,127 A | 6/1999 | Lee et al. | |
| 5,946,573 A | 8/1999 | Hsu | |
| 5,960,288 A | 9/1999 | Hong et al. | |
| 6,020,240 A | 2/2000 | Wu | |
| 6,100,127 A | 8/2000 | Wu | |
| 6,137,144 A | 10/2000 | Tsao et al. | |
| 6,143,594 A | 11/2000 | Tsao et al. | |
| 6,479,871 B2 | 11/2002 | Peters et al. | |
| 6,501,632 B1 | 12/2002 | Avery et al. | |
| 6,514,839 B1 | 2/2003 | Ker et al. | |
| 6,563,176 B2 | 5/2003 | Gauthier, Jr. et al. | |
| 6,570,226 B1 | 5/2003 | Groeseneken et al. | |
| 6,583,972 B2 | 6/2003 | Verhaege et al. | |
| 6,587,320 B1 | 7/2003 | Russ et al. | |

(Continued)

*Primary Examiner*—Kiesha R Bryant
*Assistant Examiner*—Tucker Wright
(74) *Attorney, Agent, or Firm*—Slater & Matsil, L.L.P.

(57) ABSTRACT

An ESD protection device includes a source region, a channel region adjacent the source region, and an elongated drain region spaced from the source region by the channel region. The elongated drain region includes an unsilicided portion adjacent the channel and a silicided portion spaced from channel region by the unsilicided portion. A first ESD region is located beneath the silicided portion of the elongated drain region and a second ESD region is located beneath the unsilicided portion of the elongated drain region, the second ESD region being spaced from the first ESD region.

26 Claims, 9 Drawing Sheets

U.S. PATENT DOCUMENTS

| | | |
|---|---|---|
| 6,618,233 B1 | 9/2003 | Russ et al. |
| 6,621,126 B2 | 9/2003 | Russ |
| 6,653,709 B2 * | 11/2003 | Wu et al. .................. 257/499 |
| 6,751,077 B2 | 6/2004 | Gossner |
| 6,768,616 B2 | 7/2004 | Mergens et al. |
| 6,770,918 B2 | 8/2004 | Russ et al. |
| 6,791,122 B2 | 9/2004 | Avery et al. |
| 6,803,633 B2 | 10/2004 | Mergens et al. |
| 6,815,775 B2 | 11/2004 | Ker et al. |
| 6,826,025 B2 | 11/2004 | Singh et al. |
| 6,838,734 B2 | 1/2005 | Ker et al. |
| 6,850,397 B2 | 2/2005 | Russ et al. |
| 6,888,226 B2 | 5/2005 | Diefenbeck et al. |
| 6,898,062 B2 | 5/2005 | Russ et al. |
| 6,909,149 B2 | 6/2005 | Russ et al. |
| 6,943,396 B2 | 9/2005 | McNeil |
| 6,949,799 B2 | 9/2005 | Diefenbeck et al. |
| 6,998,685 B2 | 2/2006 | Manna et al. |
| 2005/0003564 A1 | 1/2005 | Bargstadt-Franke et al. |
| 2005/0179088 A1 | 8/2005 | Glaser et al. |
| 2005/0195540 A1 | 9/2005 | Streibl et al. |

* cited by examiner

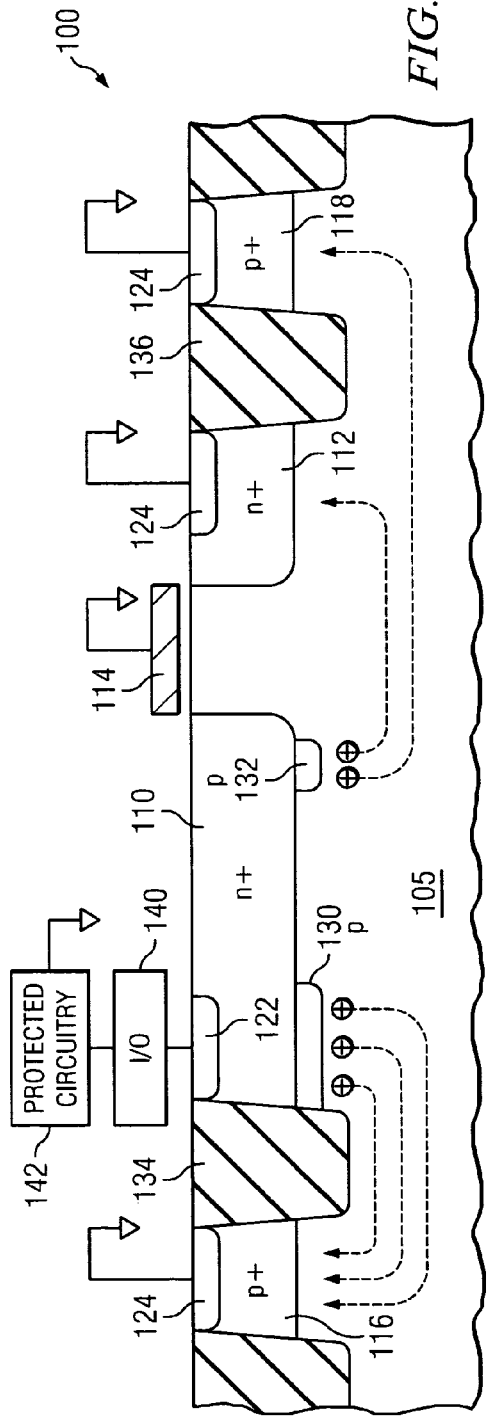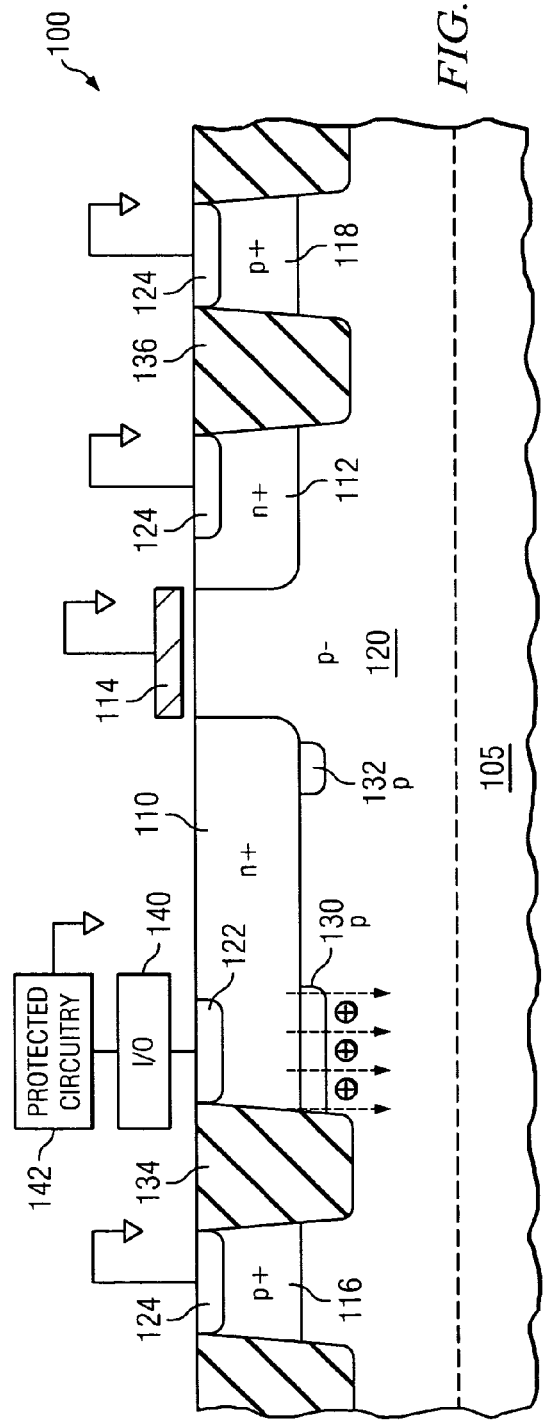

US 7,709,896 B2

ESD PROTECTION DEVICE AND METHOD

TECHNICAL FIELD

This invention relates generally to semiconductor devices, and more particularly to an ESD protection device and method.

BACKGROUND

As electronic components are getting smaller and smaller along with the internal structures in integrated circuits, it is getting easier to either completely destroy or otherwise impair electronic components. In particular, many integrated circuits are highly susceptible to damage from the discharge of static electricity. Electrostatic discharge (ESD) is the transfer of an electrostatic charge between bodies at different electrostatic potentials (voltages), caused by direct contact or induced by an electrostatic field. The discharge of static electricity, or ESD, has become a critical problem for the electronics industry.

Device failures that result from ESD events are not always immediately catastrophic or apparent. Often, the device is only slightly weakened but is less able to withstand normal operating stresses and, hence, may result in a reliability problem. Therefore, various ESD protection circuits must be included in the device to protect the various components.

When an ESD pulse occurs on a transistor, the extremely high voltage of the ESD pulse can break down the transistor and can potentially cause permanent damage. Consequently, the input/output pads of an integrated circuit need to be protected from ESD pulses so they are not damaged.

Integrated circuits and the geometry of the transistors which comprise the integrated circuits continue to be reduced in size and the transistors are arranged closer together. A transistor's physical size limits the voltage that the transistor can withstand without being damaged. Thus, breakdown voltages of transistors are lowered and currents capable of overheating components are more frequently reached by the voltages and currents induced by an ESD event. Additionally, recent advances in technology have produced devices which can fail at voltage levels lower than the triggering voltages of known ESD protection circuits. Thus, there is a need for improved ESD protection circuits with lower triggering voltages.

SUMMARY OF THE INVENTION

In one embodiment, an ESD protection device includes a source region, a channel region adjacent the source region, and an elongated drain region spaced from the source region by the channel region. The elongated drain region includes an unsilicided portion adjacent the channel and a silicided portion spaced from channel region by the unsilicided portion. A first ESD region beneath the silicided portion of the elongated drain region and a second ESD region beneath the unsilicided portion of the elongated drain region, the second ESD region being spaced from the first ESD region.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 7A-7C are cross-sectional views provided to illustrate the operation of the structure of FIG. 4.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a NMOS ESD structure. The invention may also be applied, however, to other semiconductor structures.

Before discussing details of preferred embodiments, it will be instructive to consider prior art ESD protection structures. Much of the discussion with respect to FIGS. 1-3 also applies to the embodiments of the invention.

Figure 1:
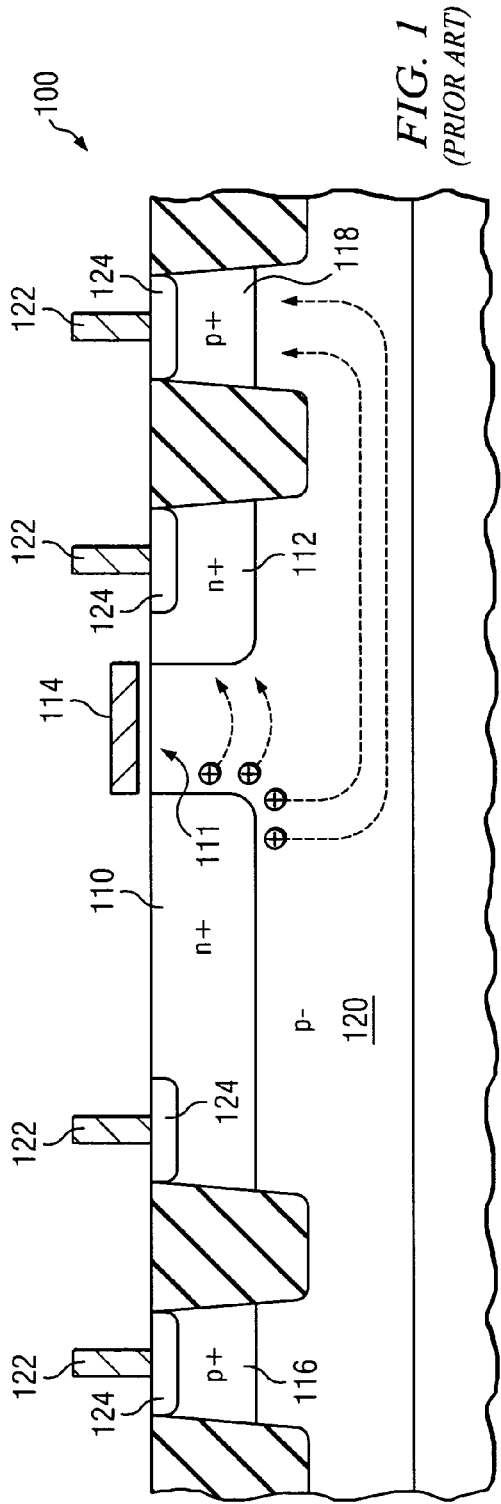
FIGS. 1 and 2 are cross-sectional views of prior art ESD protection structures.

FIG. 1 illustrates a known ESD protection device 100. This circuit includes an NMOS transistor with drain and source regions 110 and 112. A gate 114 overlies a channel region 111 between the source 112 and the drain 110. Bulk contact regions 116 and 118 are provided to allow electrical contact to the p-well region 120. Contacts 122 provide electrical contact to the doped regions 110, 112, 116 and 118. Each of these contacts is formed over a silicide region 124. In the case of the drain region 110, the silicide region 124 does not extend over the entire doped region 110.

The structure of FIG. 1 is a standard silicide-blocked NMOS device. Typical current flow lines are indicated at the snapback trigger point. Junction breakdown occurs at the junction sidewall (between drain 110 and p-well 120) and generated holes drift to the bulk contact region 118 (and 116) while turning on the parasitic bipolar transistor (formed by n-region 110/p-region 111/n-region 112). The trigger voltage is relatively high, typically between 6 and 10V.

This structure has a number of drawbacks. The ESD trigger voltage is too high and the device has a relatively high snapback holding voltage. Further the on-resistance tends to be relatively high. In addition, there is a tendency to encounter multi-finger trigger problems. Finally, the ESD current capability per layout area is not optimal.

Figure 2:
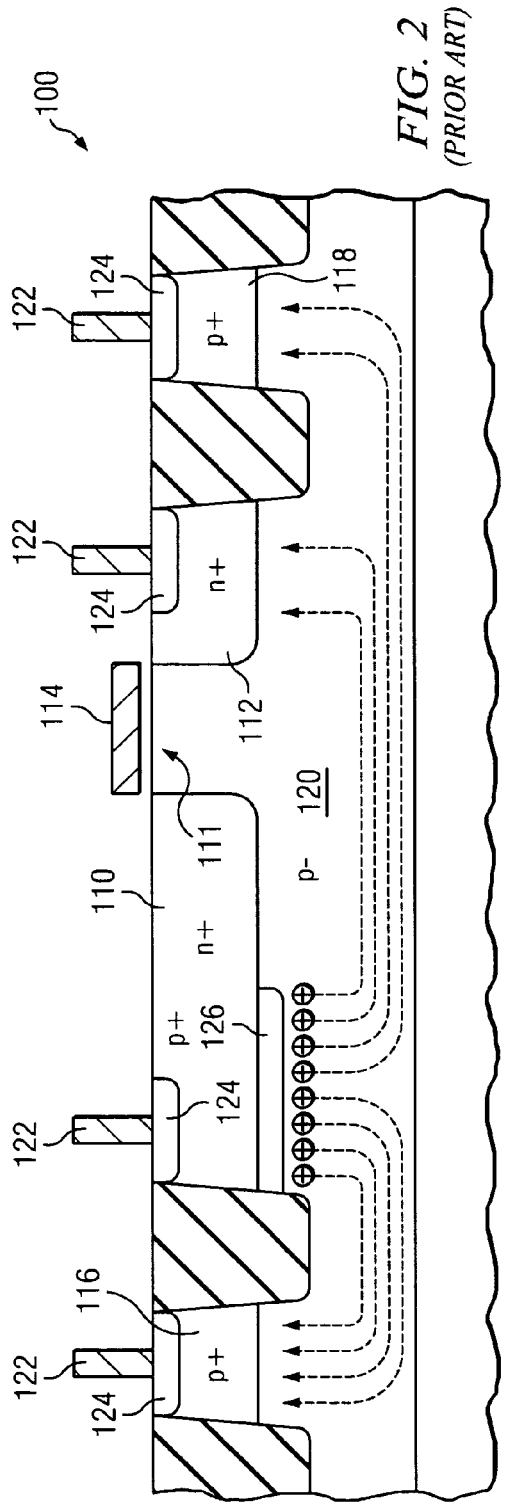
Figure 3A:
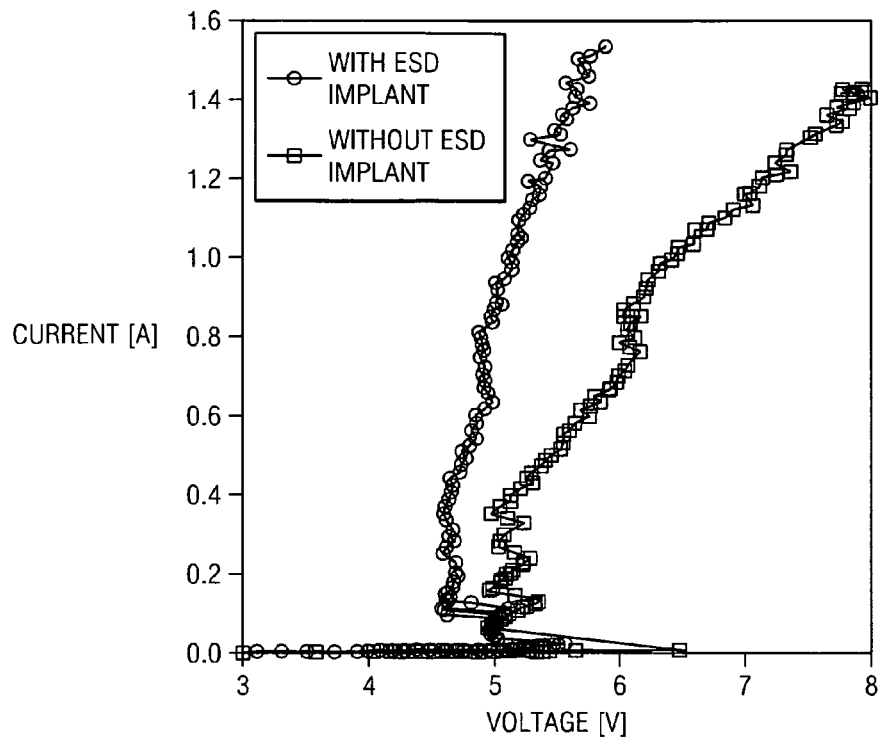
FIGS. 3A and 3B are graphs showing the relationship between current and voltage for the structures of FIGS. 1 and 2.

FIG. 2 illustrates a prior art ESD protection device 100 that is similar to the device of FIG. 1 but further includes an ESD implant region 126. ESD implants are frequently offered in foundry IC processes to improve the ESD performance of NMOS based ESD protection devices and/or of ESD endangered NMOS devices. The ESD implant region 126 is usually a p-type implant allowing the drain sided PN junction (between drain 110 and p-well 120) to break down at a lower voltage. This ensures a dedicated turn on of the protection device 100. Further, the breakdown location of the junction is moved from the junction sidewall to the bottom part of the drain/well 110/120 junction. In operation, the bottom part of the drain junction 110 enters avalanche breakdown at a lower voltage then for the case without the ESD implant region 126. A large amount of substrate current is generated drifting to bulk contacts 116 and 118.

As an example, U.S. Pat. No. 5,374,565, which is incorporated herein by reference, discloses a method of forming an ESD protection device with reduced junction breakdown voltage, simultaneously with an integrated circuit which includes FET devices. A silicon substrate is provided on which there are field oxide regions, gates, and active regions. A first ion implant of a conductivity-imparting dopant is performed in a vertical direction into the active regions of the ESD protection device and the FET devices. A first insulating layer is formed over the ESD protection device and the FET devices, and over the field oxide regions. The first insulating layer is patterned to create spacers adjacent to the gates of both the ESD protection device and the FET devices. A second ion implant of a conductivity-imparting dopant with higher concentration than dopant from the first ion implant is performed into active regions of both the ESD protection device and the FET devices. A second insulating layer is formed over the ESD protection device and the FET devices, and over the field oxide regions. The second insulating layer is patterned to form contact openings to the active regions. Finally, a third ion implant of a conductivity-imparting dopant is performed through the contact openings into active regions of the ESD protection device.

Figure 3B:
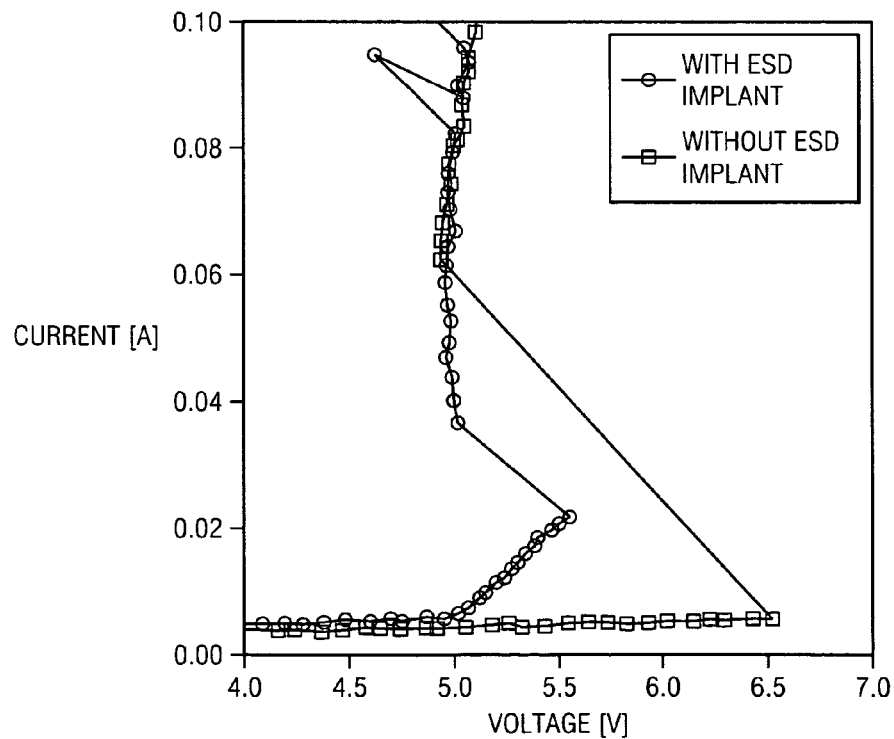

Structures that include the ESD implant region 126 also have several disadvantages. For example, these devices tend to have high leakage currents because of a reduced avalanche breakdown voltage and a large area of the ESD implanted region. The devices also tend to have high trigger currents. This is noted from the experimental results shown in the FIGS. 3A and 3B, which show the current/voltage characteristics of the structures of FIGS. 1 and 2. (FIG. 3B is an expanded view of the same data shown in FIG. 3A.)

The large ESD implanted drain region 126 enters a breakdown while "spilling" large amounts of charge carriers into the P-well/P-substrate 120/105, which flow mostly to the substrate through bulk contact regions 116, 118. Only a small portion of the carriers actively contribute to the triggering of the parasitic bipolar transistor (110/111/112). The large distance from the avalanche region (adjacent ESD-implant region 126) to the center of the bipolar transistor (which includes regions 111 and 112) additionally contributes to this undesired high trigger current. The high trigger currents lead to an increased trigger voltage because more current needs to be generated for triggering and a higher trigger voltage is built up, which consumes a large portion of the trigger voltage advantage of the ESD implant region 126.

In one aspect, the present invention uses individual regions for the ESD implant to overcome many of the disadvantages discussed above. A first small ESD-implanted region is placed as close as possible to the drain edge to generate carriers were needed for efficient triggering. With this efficient triggering, the trigger currents are reduced leading to a highly desirable reduced trigger voltage. A second ESD-implanted region is placed under the contact holes for good high-current ESD characteristics, namely, low on-resistance, low holding voltage, and high ESD hardness. The total area of the ESD implant regions is reduced over prior art. The trigger voltage is minimized while keeping the device leakage low. Further, these advantages are obtained with a straightforward design and layout.

Figure 4:
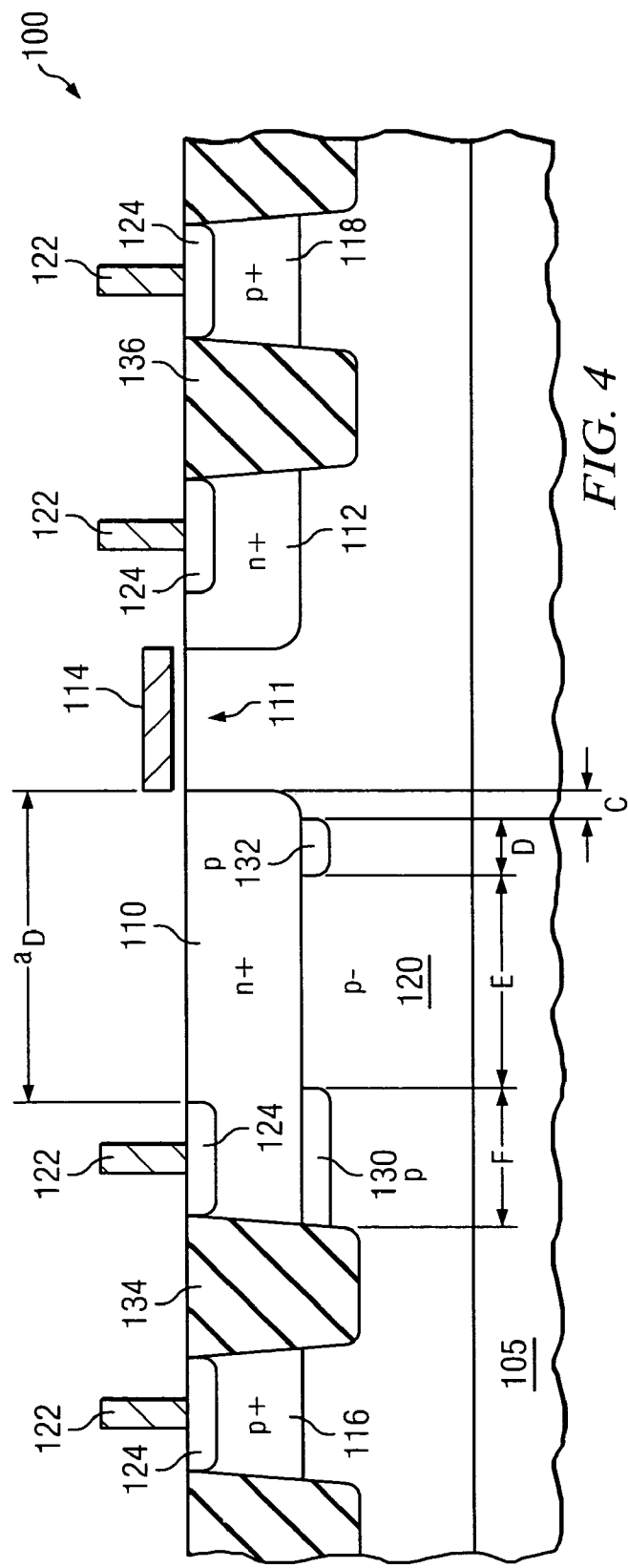
FIG. 4 illustrates a preferred embodiment structure of the present invention.

A preferred embodiment structure 100 is illustrated in FIG. 4. A substrate 105 includes a p-well region 120 formed therein. The substrate 105 is preferably a bulk monocrystalline silicon substrate and may be lightly doped with p-type dopants. The present invention can also be applied to other substrates such as an SOI (semiconductor on insulator) substrate, as just one example. Further, the polarities of the various doping regions can be reversed.

The p-well region 120 includes a number of doped regions formed therein. An elongated drain region 110 is spaced from a source region 112 by a channel region 111. The elongated drain region 110 includes an unsilicided portion adjacent the channel region 111 and a silicided region portion 124 spaced from channel region 111. The contact 122 overlies the silicide region 124. The silicide region 124 is provided to reduce the contact resistance between the contact 122 and underlying doped region 110. The silicide region 124 does not extend across the entire drain region in order to create a current-limiting resistance within the region. A gate 114 insulatively overlying the channel region 111.

As discussed above, the structure further includes the two separate ESD-implant regions 130 and 132. The first ESD region 130 is provided beneath the silicided portion of the elongated drain region 110 and the second ESD region 132 is provided beneath the unsilicided portion of the elongated drain region 110. The second ESD region 132 is located close to the drain junction edge and formed with minimized size, for example, the minimum feature size of the process technology. The first ESD region 130 is beneath the contact holes (or at least close to the contact 122). This ESD region 130 is also small but does not necessarily need to be formed to a minimized size. The ESD regions 130 and 132 do not need to be the same size.

The ESD regions 130 and 132 are formed to the opposite conductivity type of doped regions 110 and 112. In the illustrated example of an NMOS device, the doped regions 110 and 112 are n-type regions and the ESD regions 130 and 132 are p-type regions. In another embodiment, the doped regions 110 and 112 could be p-type regions and the ESD regions 130 and 132 n-type regions. The ESD implant regions typically have a lower doping concentration than the N+ drain/source regions 110/112 so that the source and drain do not get overwritten. The regions can be doped to a concentration of between about $5 \times 10^{17}$ and $7 \times 10^{18}$ atoms/cm$^3$. The ESD implant regions 130 and 132 are typically formed using a masked implantation step.

Bulk contact regions 116 and 118 are illustrated in FIG. 4 to show that electrical contact to the well region 120 is generally desired. In general, it is desirable to have at least one bulk contact in the vicinity of the protection device. This contact can be adjacent the source region 112 and/or the drain region 110. In the illustrated example, the bulk contact region 116 is a highly doped p-region that is spaced from the n-doped drain region 110 by a first insulating region 134. The insulating region 134 is illustrated as a shallow trench isolation (STI) region, although other insulators can be used. Similarly, the bulk contact region 118 is spaced from the source region 112 by a second insulating region 136. Both bulk contact regions 116 and 118 (as well as source region 112) are covered with a silicide region 124 to minimize the resistance with contact 122.

Figure 5A:
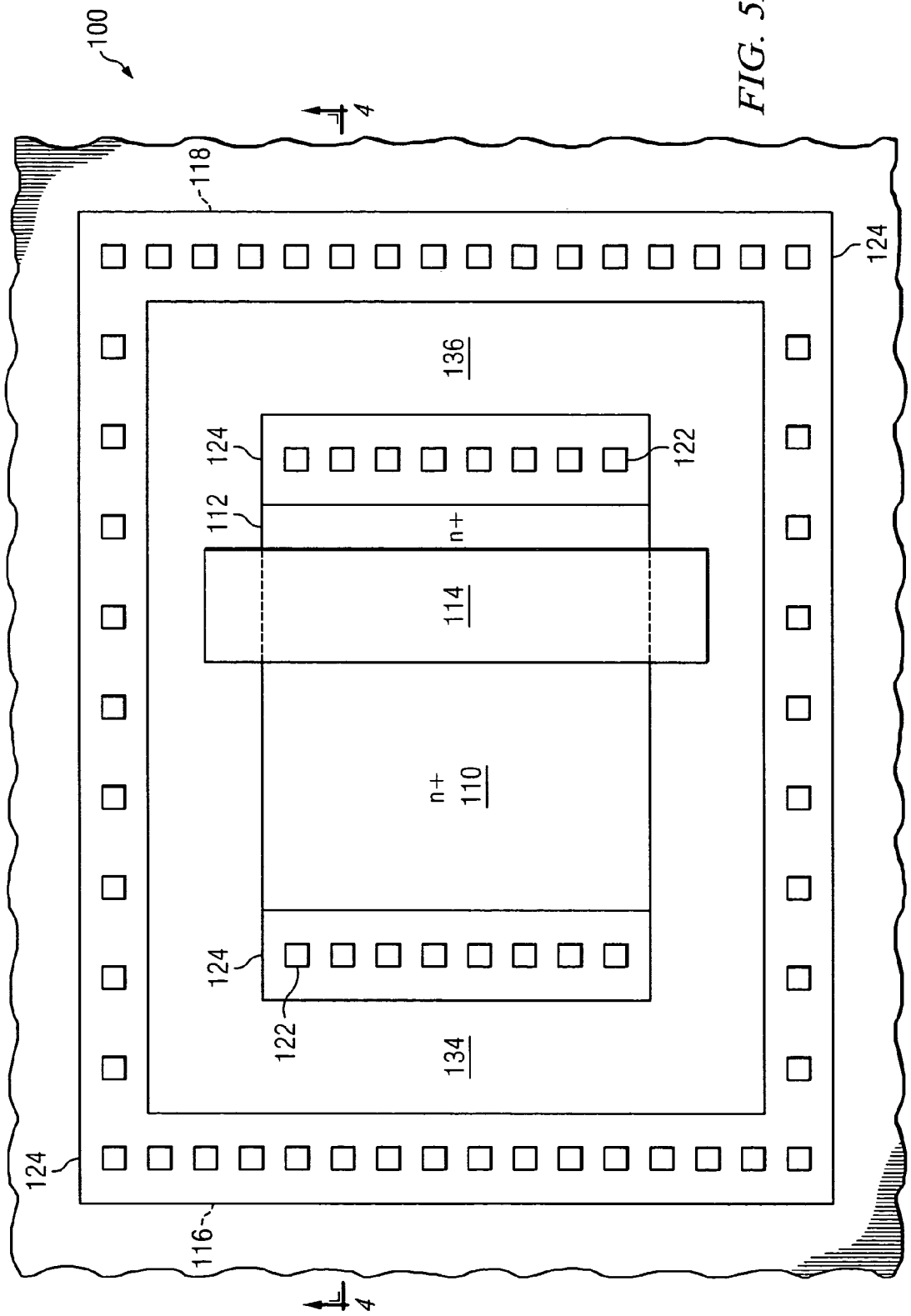
FIG. 5A shows a plan view of the embodiment of FIG. 4.

FIG. 5A shows a plan view of the embodiment of FIG. 4. In this example, the bulk contacts 116 and 118 are parts of a doped area that encloses the active area that includes drain region 110 and source region 112. In another embodiment, stripes of doped regions 116 and 118 could be included along one or both sides of the active area. As illustrated in the figure, the drain and source regions 110 and 112 each include a number of contacts 122 that overlie silicide regions 124. The bulk contact regions 116 and 118 also have a number of contacts.

Figure 5B:
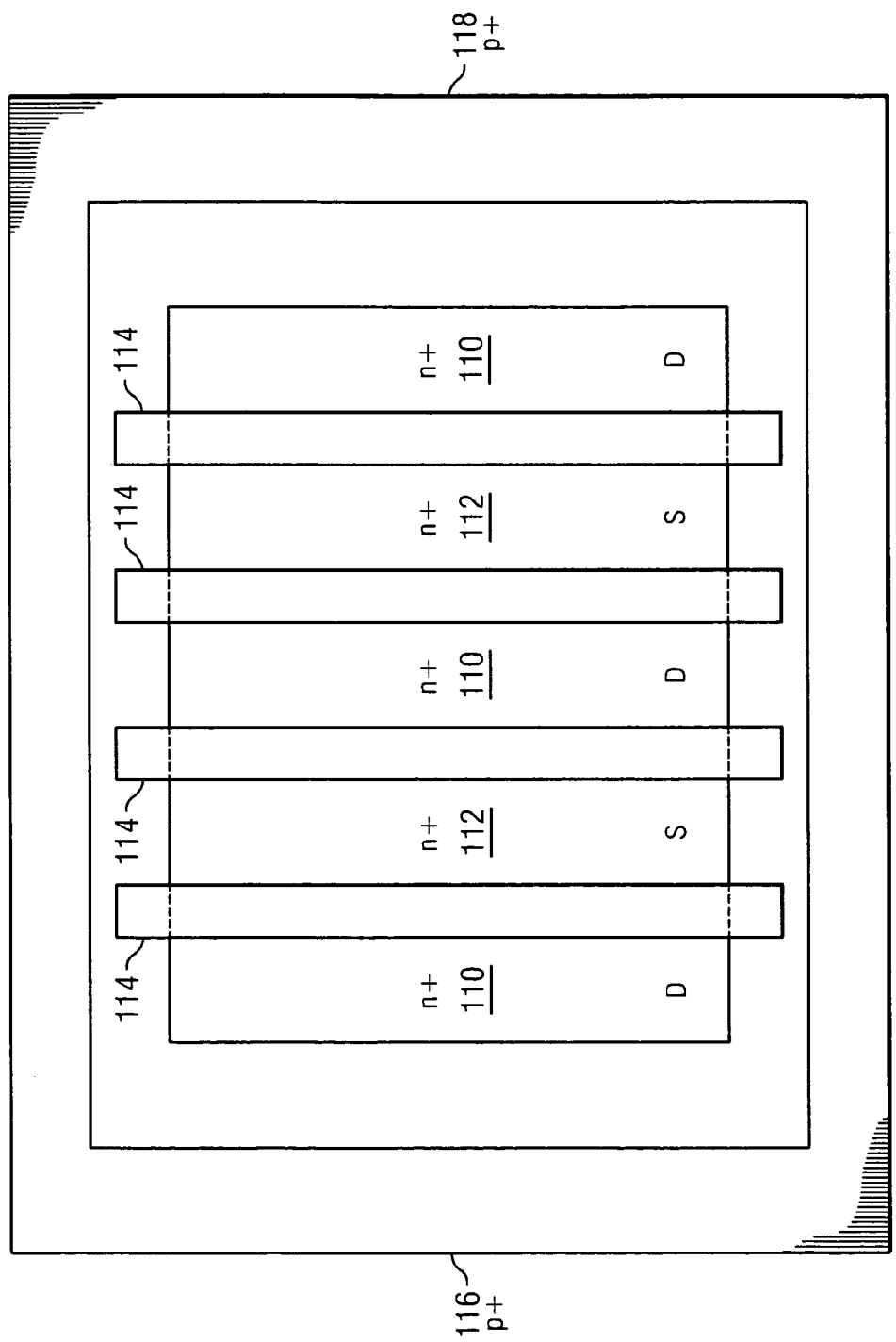
FIG. 5B illustrates a plan view of a multi-finger ESD protection device.

FIG. 5B illustrates an ESD protection device with a number of drain/sources 110/112 and gates 114, creating a so-called "multi finger" approach. In this case, a number of transistors are coupled in parallel. While not illustrated for the sake of simplicity, each of the transistors preferably includes the features discussed herein.

As an example, several dimensions C, D, E and F are illustrated in FIG. 4. These dimensions provide an example of one optimized design. It is understood that other embodiments will have different dimensions.

The dimension C is the distance of the ESD region 130 from the drain region 110 edge. Preferably this distance will use the minimum design rule so that the avalanching region is as close to the MOS channel/parasitic bipolar as possible for efficient triggering. In one example, this distance is between about 0.25 and about 0.5 µm.

The dimension D is the size of the ESD region 132, which can be thought of as the trigger region. This dimension should be designed to be the minimum, or close to the minimum, design rule for low leakage contribution while providing the necessary trigger current. In one example, this distance is between about 0.25 µm and about 0.5 µm.

The dimension E is the spacing between the ESD regions 130 and 132. This dimension is determined by the size of the silicide blocked region $a_D$ needed for sufficient the ballasting resistance and by the parameters C, D and F. The distance $a_D$ is determined by the silicide blocking mask used before the silicidation process is performed.

The dimension F is the size of the ESD region 130, which can be referred to as the high current region. This region should be large enough to enclose the region under and in close vicinity around the contacts 122. For example, the dimension F can be between about 0.5 µm and 2 µm (e.g., between about 0.75 µm and 1.25 µm). The high currents under ESD conditions are expected to flow primarily vertically into the p-well region/p-substrate 120/105 so that a further extended value for F will not enhance the ESD properties much but will only add leakage current.

Figure 6:
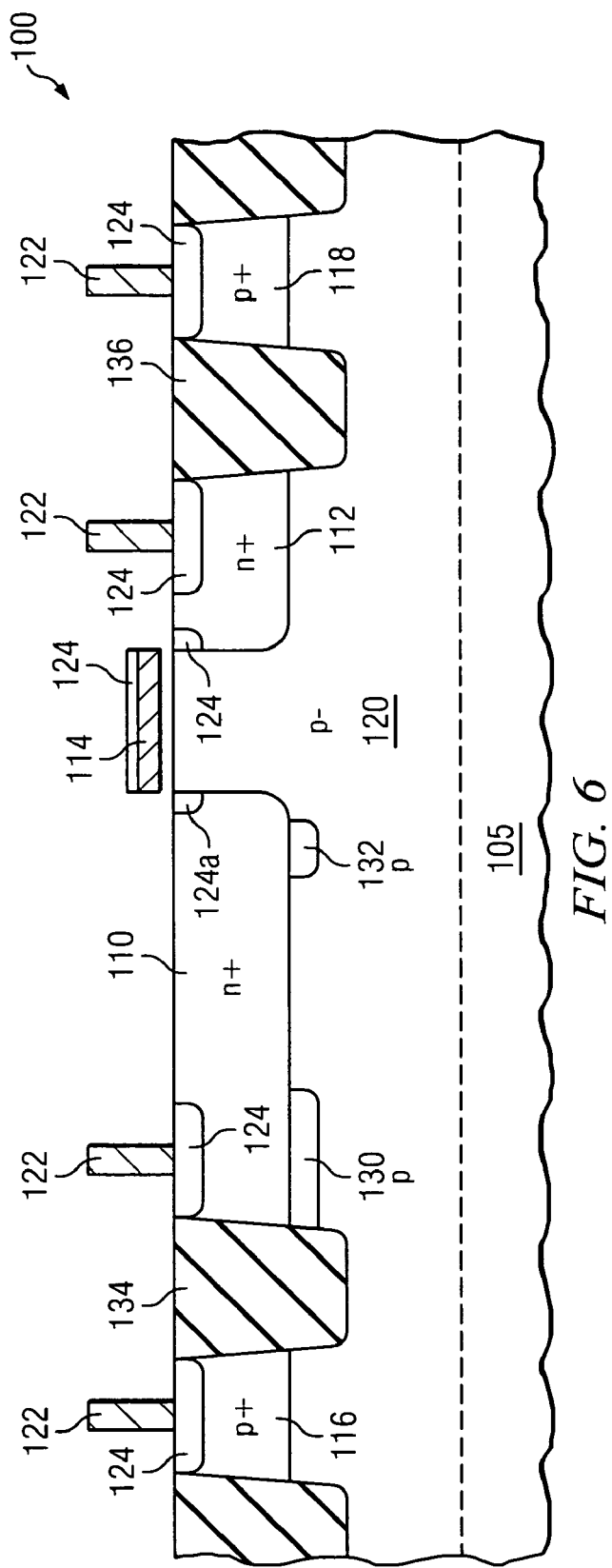
FIG. 6 illustrates an alternate embodiment structure of the present invention.

FIG. 6 illustrates an alternate embodiment device 100. This embodiment is the same as the embodiment of FIG. 4 except that the drain region 110 includes a first silicide region 124 beneath the contact 122 and also a second silicide region 124a adjacent the gate 114. This second silicide region 124a sometimes is formed, for example, when the gate 114 is silicided. Since a remaining portion of the drain region 110 is left unsilicided, the concepts discussed herein will not be affected by this additional region 124a.

The operation of the device will now be described with reference to FIGS. 7A and 7B, which are cross-sectional views provided to illustrate the current flow at various stages of operation. In this example, it is assumed that the drain region 110 will be connected to the high voltage portion of the circuitry while the source 112 and p-well region 120 are coupled to low voltage regions. In addition, the gate 114 is coupled to ground.

Figure 7C:
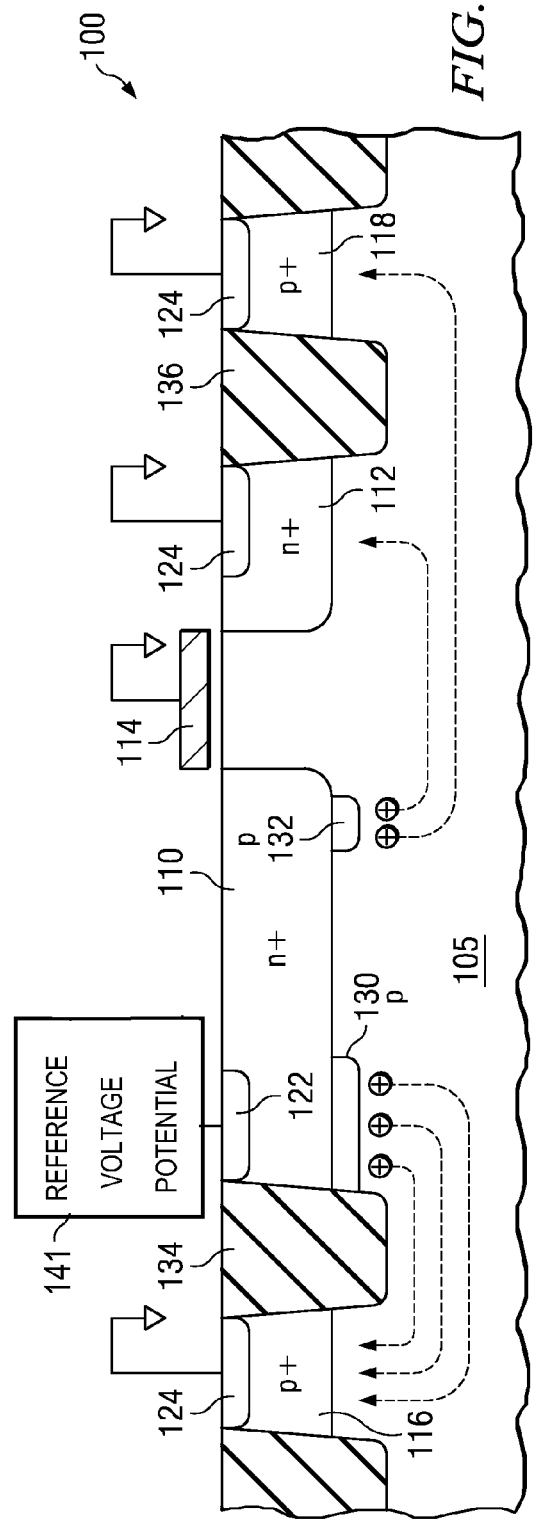

In the illustrated example, the protection device is provided to protect from high voltage spikes at an input/output pad 140. The circuitry to be protected is illustrated by the block 142. (The term input/output or I/O is intended to refer to any external contact node, whether for both input and output, input only or output only.) An I/O pad is only one example of a location in a semiconductor chip where this ESD protection can be utilized. In another example, as shown in FIG. 7C, the node 140 can be coupled to a high reference voltage 141, e.g., $V_{DD}$ or $V_{PP}$. Other applications are also envisioned. In this example, each of the low voltage regions is coupled to a ground potential.

Figure 8A:
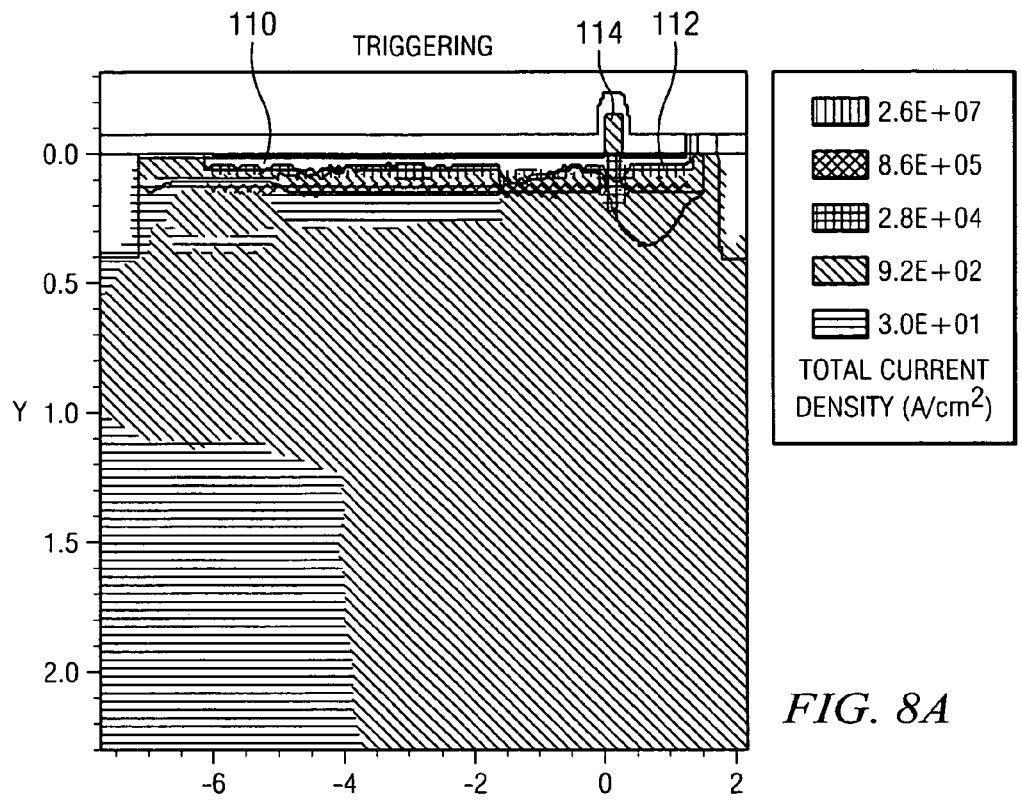
FIGS. 8A and 8B show simulations of a structure of the present invention.

FIG. 7A illustrates the operation at the trigger point, where current will flow from the ESD implant regions 130 and 132 to the lower voltage regions 112, 116 and 118. In this mode, the protection circuit causes current to flow laterally in parallel with an upper surface of the substrate 105. FIG. 8A illustrates a device simulation at this point. At the trigger point, avalanche breakdown will occur at both ESD regions 130 and 132 as the voltage goes up.

Figure 8B:
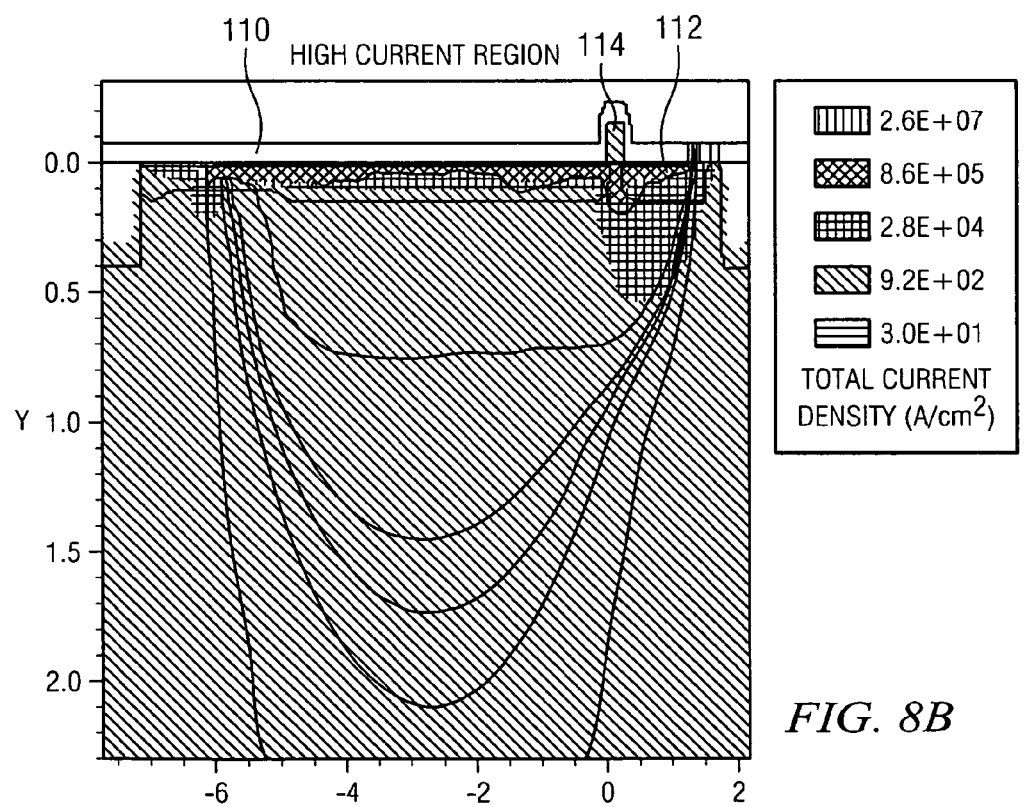

As the voltage at node 140 continues to rise, less current will flow in the trigger ESD region 132 because of the resistance of the unsilicided portion of drain region 110. At high current ESD conduction, current will flow from the drain contact into the device 100 through the high current ESD region 130. This situation is illustrated in FIG. 7B, which illustrates current flow lines in high-current ESD conduction where the ESD region 130 is beneath (or at least approximately beneath) the contact 122 to provide a low on-resistance. FIG. 8B illustrates device simulation at this point. In this case, the protection device causes current to flow from contact 122 at a surface of the substrate, vertically through the n-doped region 112, vertically through the p-doped region 130 and into the semiconductor substrate 120/100. As shown in FIG. 8B, the current can flow to a depth of 1.5 to 2 µm or more from the surface of the substrate 100. Advantageously, this operation removes self heating from the channel region 111 and from the unsilicided portion of the drain region 110, thereby boosting ESD performance.

While not illustrated, multiple rows of drain contacts 122 can be included. Each contact would have an ESD implanted region beneath it (typically merged together as a single implanted region). This would allow for more vertical current flow through the contact region and into the substrate.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device comprising:
   a semiconductor body of a first conductivity type;
   a first highly doped region of a second conductivity type disposed at a surface of the semiconductor body, the second conductivity type different than the first conductivity type;
   a second highly doped region of the second conductivity type disposed at the surface of the semiconductor body and laterally spaced from the first highly doped region by a region of the first conductivity type;

a contact overlying the first highly doped region and electrically coupled thereto;

a third doped region of the first conductivity type within the semiconductor body and spaced from the surface by the first highly doped region, the third doped region vertically underlying the contact;

a fourth doped region of the first conductivity type within the semiconductor body, spaced from the surface by the first highly doped region and laterally spaced from the third doped region by the semiconductor body, the fourth doped region adjacent a junction between the first highly doped region and the region of the first conductivity type, the fourth doped region not vertically underlying the contact; and a gate overlying and insulated from the region of the first conductivity type.

2. The device of claim 1, wherein the first conductivity type comprises p-type and the second conductivity type comprises n-type.

3. The device of claim 1, wherein an upper surface of the first highly doped region includes a silicide region beneath the contact, wherein a remaining portion of the first highly doped region that extends toward the second highly doped region is not silicided.

4. The device of claim 1, wherein an upper surface of the first highly doped region includes a first silicide region beneath the contact and a second silicide region adjacent the gate, wherein a remaining portion of the first highly doped region that extends between the first silicide region and the second silicide region is not silicided.

5. The device of claim 1, wherein the third doped region vertically underlies the contact such that a vertical line perpendicular with a plane of the surface of the semiconductor body extending through a center point of the contact passes through the third doped region.

6. A semiconductor device comprising:
a semiconductor body of a first conductivity type;
a first highly doped region of a second conductivity type disposed at a surface of the semiconductor body, the second conductivity type different than the first conductivity type;
a second highly doped region of the second conductivity type disposed at the surface of the semiconductor body and laterally spaced from the first highly doped region by a region of the first conductivity type;
a contact overlying the first highly doped region and electrically coupled thereto;
a third doped region of the first conductivity type within the semiconductor body and spaced from the surface by the first highly doped region, the third doped region vertically underlying the contact;
a fourth doped region of the first conductivity type within the semiconductor body, spaced from the surface by the first highly doped region and laterally spaced from the third doped region by the semiconductor body, the fourth doped region adjacent a junction between the first highly doped region and the region of the first conductivity type;
a gate overlying and insulated from the region of the first conductivity type;
a fifth highly doped region of the first conductivity type disposed at the surface of the semiconductor body, the fifth highly doped region spaced from the first highly doped region by a first insulating region; and
a sixth highly doped region of the first conductivity type disposed at the surface of the semiconductor body, the sixth highly doped region spaced from the second highly doped region by a second insulating region.

7. The device of claim 6, wherein the gate, the second highly doped region, the fifth highly doped region and the sixth highly doped region are all coupled to a ground potential.

8. The device of claim 7, wherein the first highly doped region is coupled to an external input/output node.

9. The device of claim 7, wherein the first highly doped region is coupled to a reference voltage potential.

10. An ESD protection device comprising:
a ground potential node;
a source region coupled to ground potential node;
a channel region adjacent the source region;
an elongated drain region spaced from the source region by the channel region so that a single transistor including the source region, channel region and elongated drain region is formed, the elongated drain region including an unsilicided portion adjacent the channel region and a silicided portion spaced from the channel region by the unsilicided portion;
a gate overlying and insulated from the channel region, wherein the gate is coupled to the ground potential node;
a first ESD region beneath the silicided portion of the elongated drain region; and
a second ESD region beneath the unsilicided portion of the elongated drain region, the second ESD region being spaced from the first ESD region, wherein the first and second ESD regions are separate ESD-implant regions.

11. The device of claim 10, further comprising at least one bulk contact region in the vicinity of the ESD protection device.

12. The device of claim 10, wherein the elongated drain region is coupled to an external input/output node.

13. The device of claim 10, wherein the elongated drain region is coupled to a reference voltage potential.

14. The device of claim 10, wherein the source region and the elongated drain region comprise n+ regions and wherein the first ESD region and the second ESD region comprise p regions.

15. The device of claim 10, wherein the unsilicided portion of the elongated drain region extends to the channel region.

16. The device of claim 10, wherein the elongated drain region further includes a second silicided portion adjacent the channel region, the unsilicided portion of the elongated drain region extending to the second silicided portion.

17. The device of claim 10, wherein the second ESD region is spaced from the first ESD region by a region of semiconductor having a lower doping concentration than either the first ESD region or the second ESD region.

18. An ESD protection device comprising:
a source region;
a channel region adjacent the source region;
an elongated drain region spaced from the source region by the channel region, the elongated drain region including an unsilicided portion adjacent the channel region and a silicided portion spaced from the channel region by the unsilicided portion;
a contact overlying the silicided portion of the elongated drain region and electrically connected thereto;
a gate overlying and insulated from the channel region;
a first ESD region beneath the silicided portion of the elongated drain region, the first ESD region vertically underlying the contact; and
a second ESD region beneath the unsilicided portion of the elongated drain region, the second ESD region being spaced from the first ESD region, the second ESD region not vertically underlying the contact, wherein the first and second ESD regions are separate ESD-implant regions.

19. The device of claim 18, further comprising at least one bulk contact region in the vicinity of the ESD protection device.

20. The device of claim 18, wherein the gate and the source region are coupled to a ground potential.

21. The device of claim 20, wherein the elongated drain region is coupled to an external input/output node.

22. The device of claim 20, wherein the elongated drain region is coupled to a reference voltage potential.

23. The device of claim 18, wherein the source region and the elongated drain region comprise n+ regions and wherein the first ESD region and the second ESD region comprise p regions.

24. The device of claim 18, wherein the unsilicided portion of the elongated drain region extends to the channel region.

25. The device of claim 18, wherein the elongated drain region further includes a second silicided portion adjacent the channel region, the unsilicided portion of the elongated drain region extending to the second silicided portion.

26. The device of claim 18, wherein the first ESD region vertically underlies the contact such that a vertical line perpendicular with a plane of an upper surface of the elongated drain region that extends through a center point of the contact passes through the first ESD region.

* * * * *